US009253903B2

(12) United States Patent
Kawada et al.

(10) Patent No.: US 9,253,903 B2
(45) Date of Patent: Feb. 2, 2016

(54) ELECTRIC APPARATUS WITH SUPPORT LEG

(71) Applicant: Panasonic Corporation, Kadoma-shi, Osaka (JP)

(72) Inventors: Yoshihiro Kawada, Osaka (JP); Kenichi Shindo, Osaka (JP); Ryo Yonezawa, Kyoto (JP); Yoshinari Matsuyama, Osaka (JP); Hirofumi Sasaki, Hyogo (JP); Haruka Kaneko, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 62 days.

(21) Appl. No.: 13/940,613

(22) Filed: Jul. 12, 2013

(65) Prior Publication Data

US 2014/0063701 A1    Mar. 6, 2014

(30) Foreign Application Priority Data

Sep. 4, 2012 (JP) .................................. 2012-194467

(51) Int. Cl.
*H05K 5/02*        (2006.01)
*G06F 1/16*        (2006.01)

(52) U.S. Cl.
CPC .............. *H05K 5/0217* (2013.01); *G06F 1/166* (2013.01); *G06F 1/1618* (2013.01); *G06F 1/1681* (2013.01)

(58) Field of Classification Search
CPC ... G06F 1/1616; G06F 1/1637; G06F 1/1656; G06F 1/1626; G06F 1/203; G06F 1/1681; G06F 1/1679; G06F 1/1683; G06F 1/1654; G06F 1/1601; G06F 1/1632; E05Y 2900/606; E05D 11/0081
See application file for complete search history.

(56) References Cited

U.S. PATENT DOCUMENTS

| | | | | |
|---|---|---|---|---|
| 5,901,035 A * | 5/1999 | Foster et al. | ............. | 361/679.55 |
| 6,097,592 A * | 8/2000 | Seo et al. | ............. | 361/679.55 |
| 6,460,221 B1 * | 10/2002 | Eromaki | ......................... | 16/286 |
| 6,473,296 B2 * | 10/2002 | Amemiya et al. | ........ | 361/679.27 |
| 6,612,668 B2 * | 9/2003 | Doan | ........................ | 312/223.2 |
| 6,768,637 B1 * | 7/2004 | Amemiya | ................ | 361/679.55 |
| 6,930,881 B2 * | 8/2005 | Karidis et al. | ............ | 361/679.55 |
| 7,121,876 B2 * | 10/2006 | Chien | ........................... | 439/500 |
| 7,576,981 B2 * | 8/2009 | Kuo | .......................... | 361/679.59 |
| 7,821,786 B2 * | 10/2010 | Hadad et al. | ............. | 361/679.59 |

(Continued)

FOREIGN PATENT DOCUMENTS

JP        09-148757        6/1997

*Primary Examiner* — Hoa C. Nguyen
*Assistant Examiner* — Xanthia C Cunningham
(74) *Attorney, Agent, or Firm* — Hamre, Schumann, Mueller & Larson, P.C.

(57) ABSTRACT

An electronic device 100 includes: a hinge mechanism 120 configured to rotate, on a portion in which a first casing 101 is connected to a second casing 102, the second casing 102 to allow the electronic device 100 to switch from a closed position through an opened position to an inverted position; and exterior components 123 and 124 each configured to rotate with the second casing 102 when switching between the opened position and the inverted position is performed, and to switch between a state where the exterior component projects from the back surface of the first casing 101 to be a leg for the electronic device 100 in the opened position, and a state where the exterior component projects from the top surface of the first casing 101 to be a leg for the electronic device 100 in the inverted position.

5 Claims, 6 Drawing Sheets

(56) References Cited

U.S. PATENT DOCUMENTS

| | | | |
|---|---|---|---|
| 7,929,298 B2* | 4/2011 | Hsu | 361/679.59 |
| 7,948,753 B2* | 5/2011 | Wang | 361/679.59 |
| 8,014,147 B2* | 9/2011 | Chen et al. | 361/679.56 |
| 8,081,446 B2* | 12/2011 | Hsu | 361/679.55 |
| 8,320,123 B2* | 11/2012 | Chen | 361/679.59 |
| 8,547,689 B2* | 10/2013 | Moser | 361/679.01 |
| 8,752,249 B1* | 6/2014 | Tsai et al. | 16/357 |
| 8,787,010 B2* | 7/2014 | Arima | 361/679.28 |
| 8,792,231 B2* | 7/2014 | Derryberry | 361/679.26 |
| 2001/0046116 A1* | 11/2001 | Amemiya et al. | 361/683 |
| 2006/0007648 A1* | 1/2006 | Wang | 361/683 |
| 2006/0126281 A1* | 6/2006 | Kwon | 361/681 |
| 2010/0016038 A1* | 1/2010 | Demuynck et al. | 455/575.3 |
| 2010/0053876 A1* | 3/2010 | Widmer et al. | 361/679.27 |
| 2010/0118481 A1* | 5/2010 | Wang | 361/679.27 |
| 2011/0128216 A1* | 6/2011 | Renwick | 345/156 |
| 2011/0161710 A1* | 6/2011 | Huang et al. | 713/324 |
| 2011/0164377 A1* | 7/2011 | Wang | 361/679.55 |
| 2011/0199726 A1* | 8/2011 | Moser | 361/679.09 |
| 2011/0267757 A1* | 11/2011 | Probst et al. | 361/679.09 |
| 2013/0155598 A1* | 6/2013 | Kontkanen et al. | 361/679.27 |
| 2014/0133079 A1* | 5/2014 | Noguchi et al. | 361/679.09 |
| 2014/0340829 A1* | 11/2014 | Matsumoto et al. | 361/679.27 |

* cited by examiner

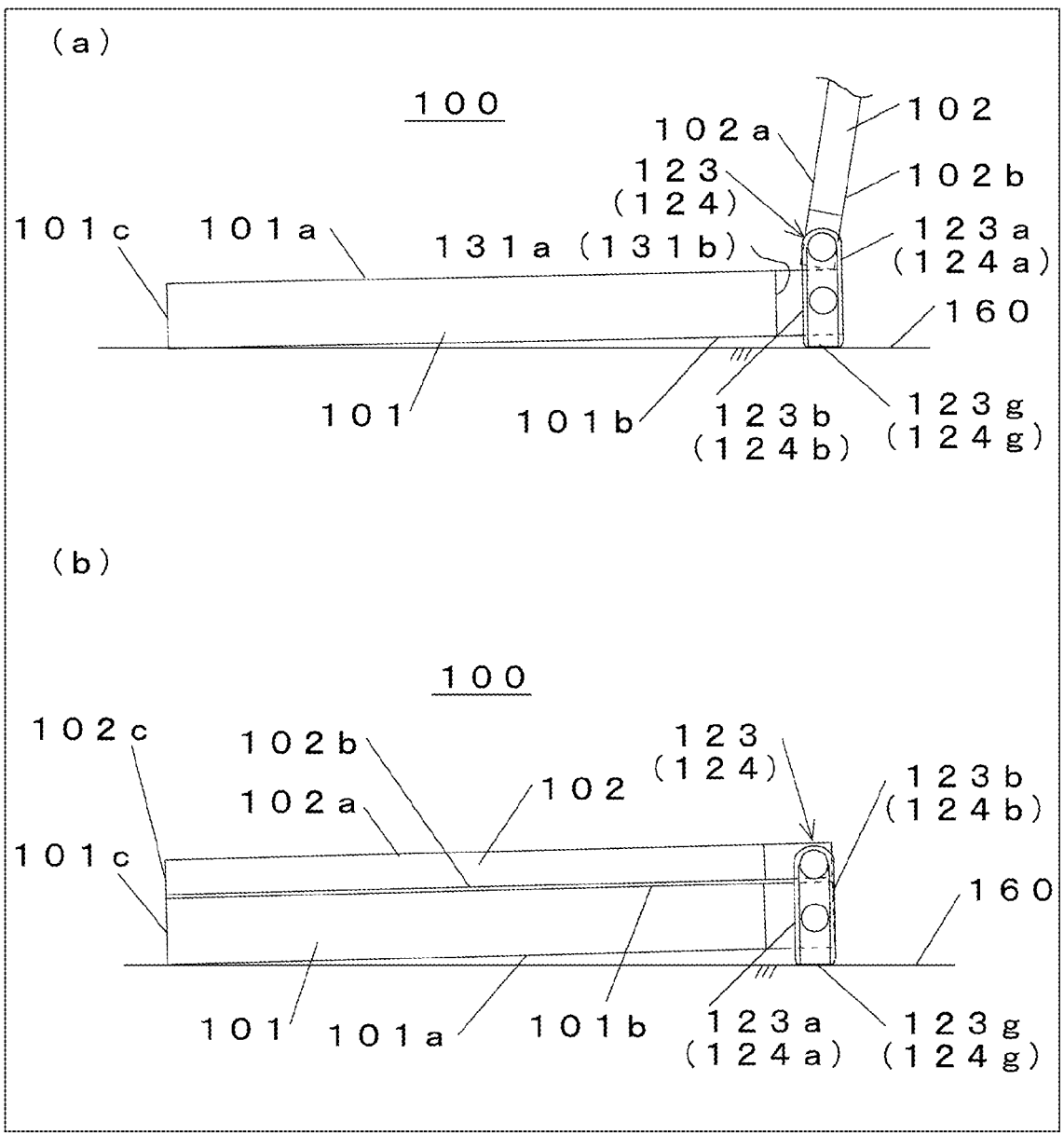

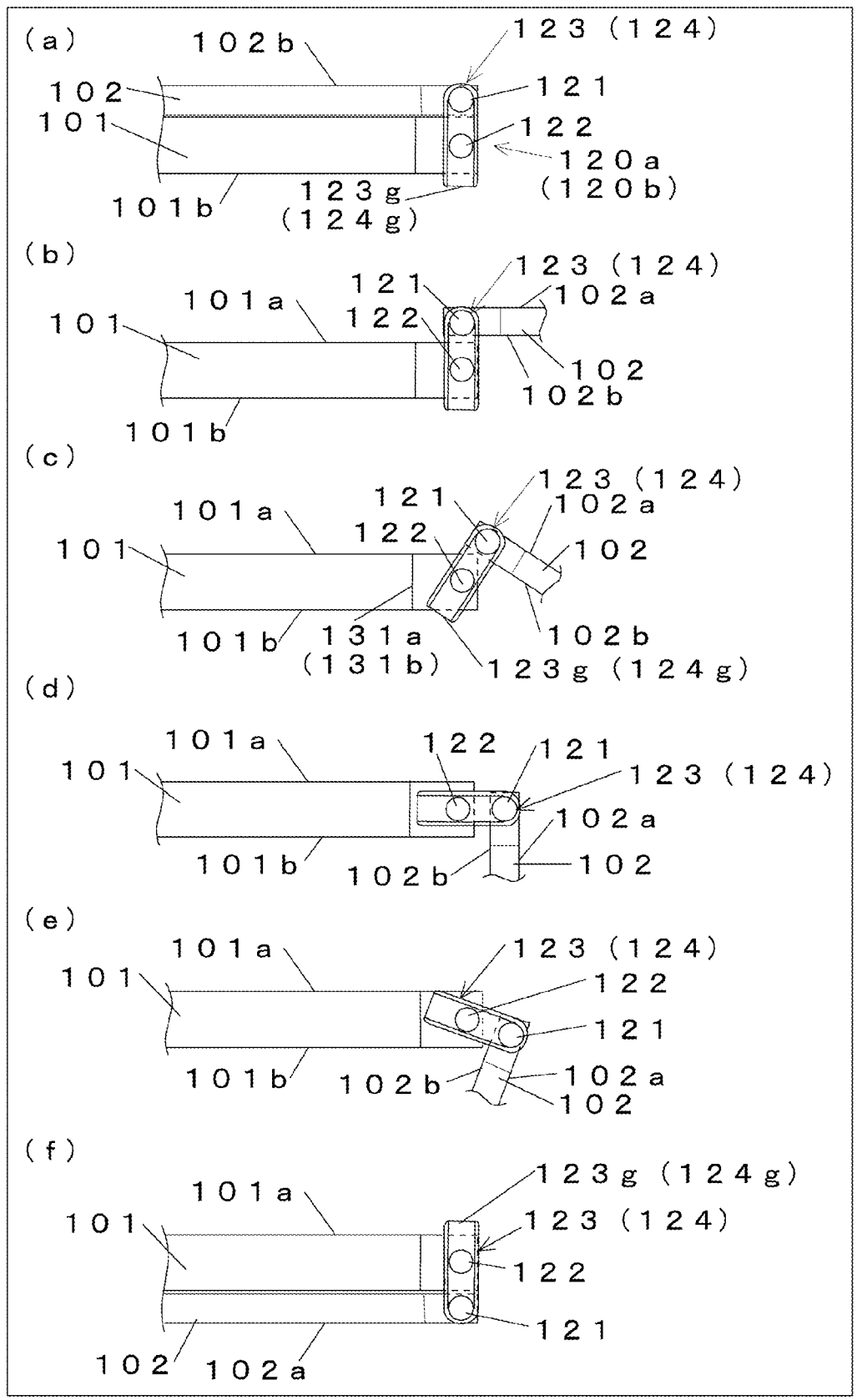

ELECTRIC APPARATUS WITH SUPPORT LEG

BACKGROUND

1. Field

The present disclosure relates to electronic devices having a first casing and a second casing that are connected to each other by a hinge mechanism.

2. Description of the Related Art

Japanese Laid-Open Patent Publication No. 9-148757 discloses an electronic device in which a cover for protecting a body surface can be rotated about a hinge shaft and folded onto the back side of the body.

In this electronic device, a hinge unit is provided between the cover and the body and pivotally supported, through the hinge shaft, by the cover and the body. In the hinge unit, a stand component for tilting the body is accommodated. The stand component can be drawn from the hinge unit.

SUMMARY

The present disclosure is to make available an electronic device that can switch from a closed position where a front surface of a second casing overlaps a front surface of a first casing, through an opened position where the second casing is raised relative to the first casing, to an inverted position where a back surface of the second casing overlaps a back surface of the first casing, and that includes a component useful as a leg.

An electronic device of the present disclosure includes: a first casing having an operation section on a top surface; a second casing having a display on a front surface; a hinge mechanism configured to connect the first casing to the second casing, the hinge mechanism configured to rotate the second casing, relative to the first casing, on a connection portion in which the first casing is connected to the second casing, to allow the electronic device to switch from a closed position where the front surface of the second casing overlaps the top surface of the first casing, through an opened position where the second casing is raised relative to the first casing, to an inverted position where a back surface of the second casing overlaps a back surface of the first casing, the hinge mechanism configured to rotate according to the second casing being rotated when switching between the opened position and the inverted position is performed; and an exterior component configured to rotate with the hinge mechanism when switching between the opened position and the inverted position is performed, and to switch, by rotating with the hinge mechanism, between a state where the exterior component projects from the back surface of the first casing to be a leg for the electronic device in the opened position, and a state where the exterior component projects from the top surface of the first casing to be a leg for the electronic device in the inverted position.

The present disclosure is to make available an electronic device that can switch from a closed position through an opened position to an inverted position, and that includes a component useful as a leg.

BRIEF DESCRIPTION OF THE DRAWINGS

FIG. 10 illustrates a state where the electronic device according to the embodiment is placed on a setting surface; and FIG. 11 is a cross-sectional view illustrating movements of a hinge mechanism and the exterior component for switching the electronic device according to the embodiment from the closed position to the inverted position.

DETAILED DESCRIPTION

Hereinafter, embodiments will be described in detail with reference to the drawings as appropriate. However, there will be instances in which detailed description beyond what is necessary is omitted. For example, detailed description of subject matter that is previously well-known, as well as redundant description of components that are substantially the same will in some cases be omitted. This is to prevent the following description from being unnecessarily lengthy, in order to facilitate understanding by a person of ordinary skill in the art.

The inventors provide the following description and the accompanying drawings in order to allow a person of ordinary skill in the art to sufficiently understand the present disclosure, and the description and the drawings are not intended to restrict the subject matter of the scope of the patent claims.

Hereinafter, an exemplary embodiment will be described with reference to FIGS. 1 to 11.

[1. Entire Configuration of Electronic Device]

Figure 1:
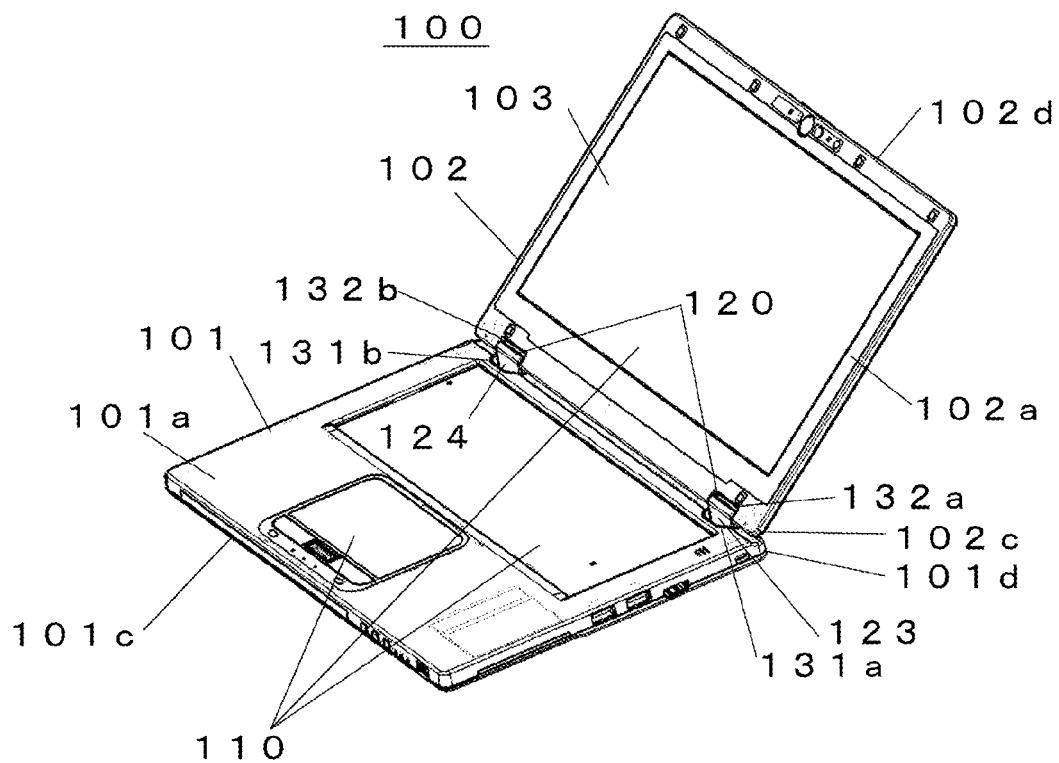
FIG. 1 is a perspective view of an electronic device, in an opened position, according to one embodiment.
Figure 2:
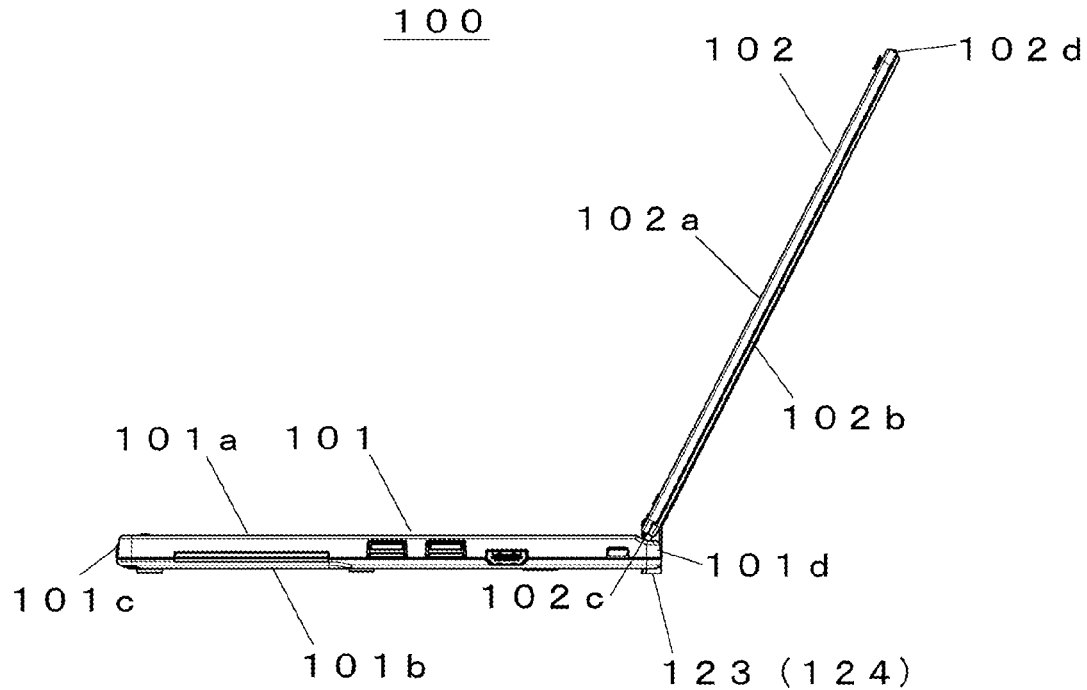
FIG. 2 is a side view of the electronic device, in the opened position, according to the embodiment.
Figure 3:
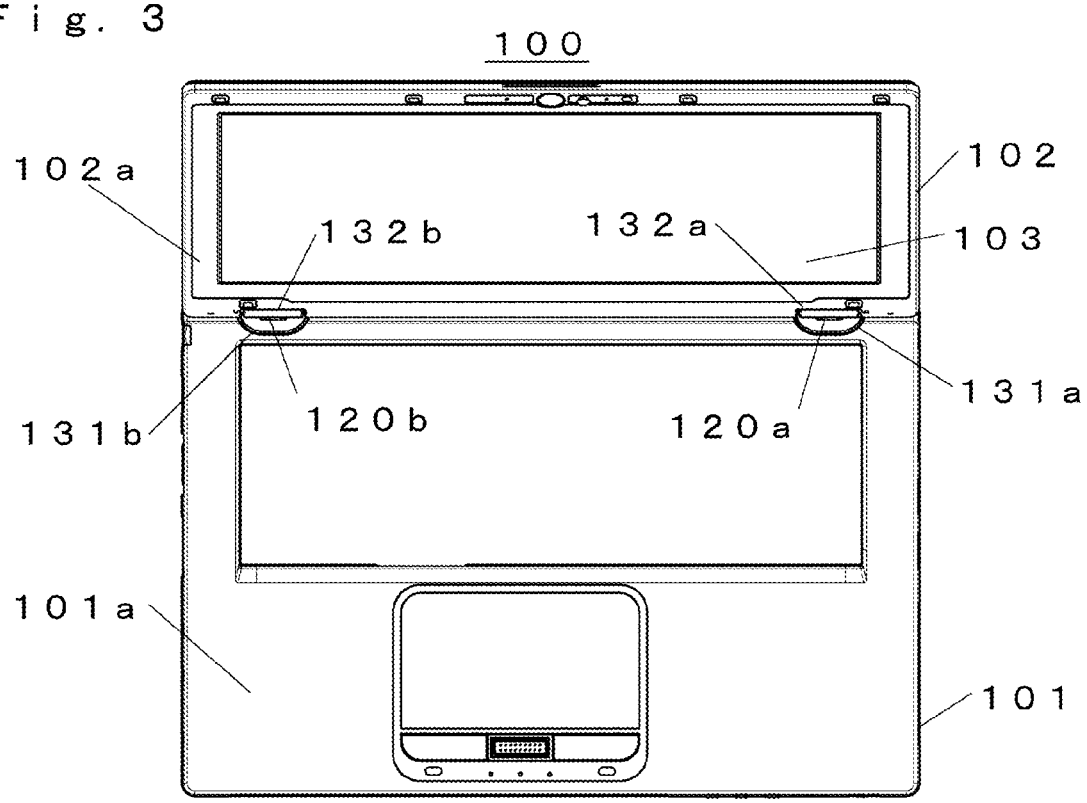
FIG. 3 is a top view of the electronic device, in the opened position, according to the embodiment.
Figure 4:
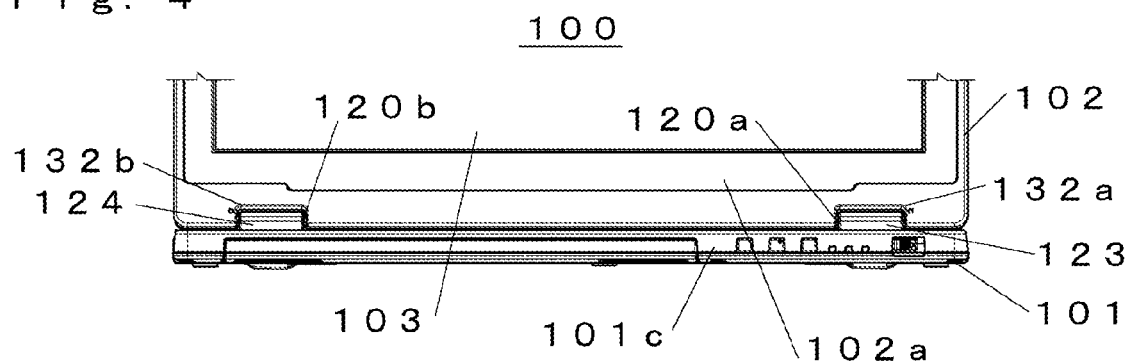
FIG. 4 is a front view illustrating a front side end face of a first casing according to the embodiment.
Figure 5:
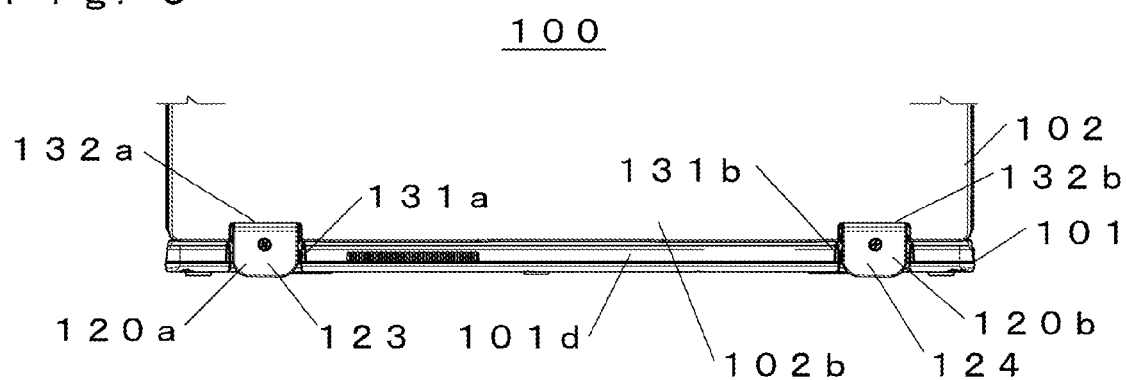
FIG. 5 is a front view illustrating a rear side end face of the first casing according to the embodiment.
Figure 6:
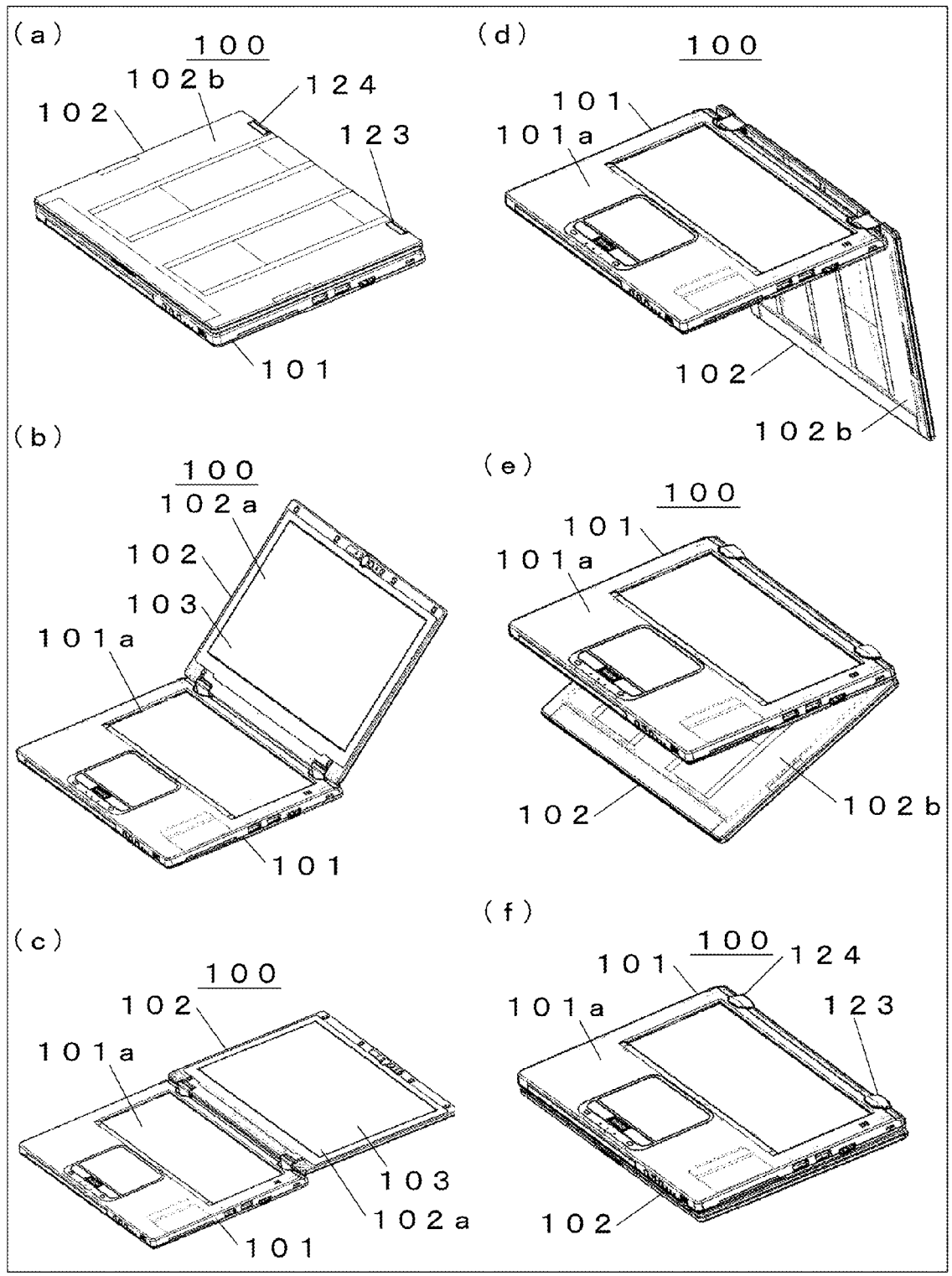
FIG. 6 is a perspective view of the electronic device according to the embodiment in a state where the electronic device is being switched from a closed position through the opened position to an inverted position.

FIG. 1 is a perspective view of an electronic device 100, in an opened position, according to the present embodiment. FIG. 2 is a side view of the electronic device 100, in the opened position, according to the present embodiment. FIG. 3 is a top view of the electronic device 100, in the opened position, according to the present embodiment. FIG. 4 is a front view illustrating a front side end face 101c of a first casing 101 according to the present embodiment. FIG. 5 is a front view illustrating a rear side end face 101d of the first casing 101 according to the present embodiment. FIG. 6 is a perspective view of the electronic device 100 according to the present embodiment in a state where the electronic device 100 is being switched from a closed position through the opened position to an inverted position.

As shown in FIG. 1, the electronic device 100 of the present embodiment is a notebook computer which is one example of an information processing apparatus. The electronic device 100 includes: the first casing 101 having operation sections 110 provided on a top surface 101a; a second casing 102 having a display 103 provided on a front surface 102a; a hinge mechanism 120 connecting a rear side portion of the first casing 101 to one of end portions (a lower side portion in FIG. 1) of the second casing 102; and exterior components 123 and 124 that act as legs for the electronic device 100. In the present embodiment, the exterior components 123 and 124 are covers for the hinge mechanism 120. The operation sections 110 are sections on which an operation is received from a user of the electronic device 100, and are implemented as, for example, a keyboard, a touch pad, and a touch panel. The touch panel is disposed on the display 103 so as to overlap the display 103. In the following description, the hinge mechanism 120 side of the first casing 101 is referred to as "far side" or "rear side", and a side opposite thereto is referred to as "near side" or "front side".

As shown in FIG. 1 and FIG. 2, the first casing 101 is a thin casing having a roughly rectangular shape as viewed in a planar manner. The first casing 101 has the top surface 101a, a back surface 101b, the front side end face 101c, and the rear side end face 101d (far side end face). The first casing 101 has a CPU, a memory, an HDD, a battery, and the like mounted therein (not shown). The keyboard and the touch pad of the operation sections 110 as described above are provided on the top surface 101a of the first casing 101. For example, a portion through which the battery is removed is formed on the back surface 101b of the first casing 101 (not shown). A connection terminal for an electrical cord, a connection port (for example, a USB port) for a peripheral device, and the like are formed on the outer circumferential surface (a surface extending in the thickness direction of the first casing 101) of the first casing 101 (not shown).

As shown in FIG. 1, in the first casing 101, a first hinge recess 131a and a second hinge recess 131b are formed in the rear side end face 101d so as to be recessed toward the near side of the first casing 101. In the hinge recesses 131a and 131b, the hinge mechanism 120 and the exterior components 123 and 124 are provided. The first hinge recess 131a is formed near the far right side corner of the first casing 101 in FIG. 3. The second hinge recess 131b is formed near the far left side corner of the first casing 101 in FIG. 3.

Each of the hinge recesses 131a and 131b has a width, in the left-right direction of the first casing 101, which is greater than a depth in the upward-downward direction (the front-rear direction of the first casing 101) in FIG. 3. When each of the hinge recesses 131a and 131b is viewed from above the first casing 101, roughly arc-shaped wall surfaces extend toward the far side from both ends, respectively, of a linear bottom surface located on the near side (the lower side in FIG. 3), so as to spread in the width direction (the left-right direction in FIG. 3). The width of each of the hinge recesses 131a and 131b is reduced toward the front side of the first casing 101.

As shown in FIG. 1 and FIG. 2, the second casing 102 is a thin casing having a roughly rectangular shape as viewed in a planar manner. The second casing 102 has the front surface 102a, a back surface 102b, a base end face 102c, and a top end face 102d. The shape and size of the second casing 102 are almost the same as the shape and size of the first casing 101, as viewed in the planar manner. In the second casing 102, the display 103 occupies a large part of the front surface 102a. In the second casing 102, the back surface 102b opposite to the display 103 is a shield surface for protecting the electronic device 100.

As shown in FIG. 1, in the second casing 102, a first hinge recess 132a and a second hinge recess 132b are formed in the base end face 102c so as to be recessed toward the top end face of the second casing 102. The hinge recesses 132a and 132b are formed at such positions as to correspond to the hinge recesses 131a and 131b, respectively, of the first casing 101. In the hinge recesses 132a and 132b, the hinge mechanism 120 and the exterior components 123 and 124 are provided. The first hinge recess 132a is formed near the lower right corner of the second casing 102 in FIG. 4. The second hinge recess 132b is formed near the lower left corner of the second casing 102 in FIG. 4.

Each of the hinge recesses 132a and 132b has a width, in the left-right direction of the second casing 102, which is greater than a depth in the upward-downward direction in FIG. 4. When each of the hinge recesses 132a and 132b is viewed from the front of the second casing 102, linear wall surfaces extend from both ends, respectively, of a linear bottom surface in almost the perpendicularly downward direction. Each of the hinge recesses 132a and 132b has an almost uniform width in the depth direction. Each of the hinge recesses 132a and 132b has a width that is almost equal to the width of an opening of each of the hinge recesses 131a and 131b of the first casing 101.

As shown in FIG. 5, the hinge mechanism 120 includes a first rotation mechanism 120a and a second rotation mechanism 120b. The first rotation mechanism 120a is connected to the first casing 101 in the first hinge recess 131a of the first casing 101 so as to be rotatable, and is connected to the second casing 102 in the first hinge recess 132a of the second casing 102 so as to be rotatable. On the other hand, the second rotation mechanism 120b is connected to the first casing 101 in the second hinge recess 131b of the first casing 101 so as to be rotatable, and is connected to the second casing 102 in the second hinge recess 132b of the second casing 102 so as to be rotatable. The hinge mechanism 120 will be described below in detail.

The exterior components 123 and 124 include the first exterior component 123 that is a cover for the first rotation mechanism 120a, and the second exterior component 124 that is a cover for the second rotation mechanism 120b. The first exterior component 123 is disposed across the first hinge recess 131a of the first casing 101, and the first hinge recess 132a of the second casing 102. On the other hand, the second exterior component 124 is disposed across the second hinge recess 131b of the first casing 101 and the second hinge recess 132b of the second casing 102. The exterior components 123 and 124 will be described below in detail.

The hinge mechanism 120 is structured so as to allow the electronic device 100 to switch from a closed position through an opened position to an inverted position by the second casing 102 pivoting on a portion at which the first casing 101 and the second casing 102 are connected to each other. The second casing 102 can pivot on the portion at which the first casing 101 and the second casing 102 are connected to each other, to rotate about 360 degrees by means of the hinge mechanism 120. As shown in FIG. 6(a), in the closed position, the electronic device 100 is closed such that the front surface 102a of the second casing 102 overlaps the top surface 101a of the first casing 101. In the closed position, the display 103 opposes the keyboard of the first casing 101.

When the second casing 102 is rotated from the closed position, the electronic device 100 enters the opened position as shown in FIG. 6(b). In the opened position, the electronic device 100 is opened such that the second casing 102 is away from the near side of the first casing 101. In the opened position, a user is allowed to view the display 103 from the near side of the first casing 101. When the second casing 102 is further rotated in the state shown in FIG. 6(b), the electronic device 100 enters the opened position as shown in FIG. 6(c) where the front surface 102a of the second casing 102 and the top surface 101a of the first casing 101 face in the same direction. When the second casing 102 is further rotated in the state shown in FIG. 6(c), the electronic device 100 is switched through a position, as shown in FIG. 6(d), where the front surface 102a of the second casing 102 faces rearward, and a position, as shown in FIG. 6(e), where the back surface 102b of the second casing 102 is close to the back surface 101b of the first casing 101, to the inverted position, as shown in FIG. 6(f), where the back surface 102b of the second casing 102 overlaps the back surface 101b of the first casing 101. In the inverted position, a user is allowed to use the electronic device 100 like a tablet. In this case, for example, the user is allowed to use the electronic device 100 in a state where the display 103 faces upward, and the top surface 101a of the first casing faces downward.

When the second casing 102 is rotated in the direction opposite to the direction in which the closed position is switched to the inverted position, the electronic device 100 is returned from the inverted position through the opened position to the closed position. When the position shown in FIG. 6(a) is switched to the position shown in FIG. 6(c), although the second casing 102 rotates, the first exterior component 123 and the second exterior component 124 do not rotate. On the other hand, when the position shown in FIG. 6(c) is switched to the position shown in FIG. 6(f), the first exterior component 123 and the second exterior component 124 each rotate almost 180 degrees about a second rotation shaft 122 described below according to the rotation of the second casing 102.

[2. Structures of Exterior Components and Hinge Mechanism]

Figure 7:
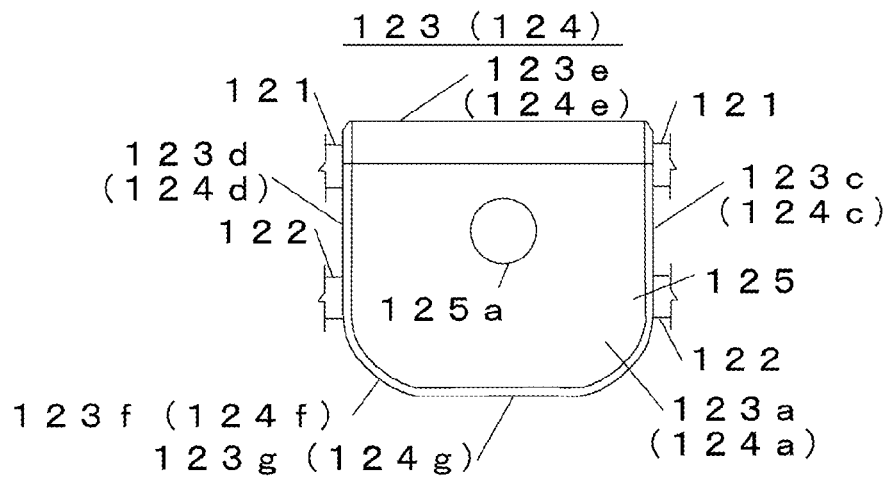
FIG. 7 is a front view of an exterior component according to the embodiment.
Figure 8:
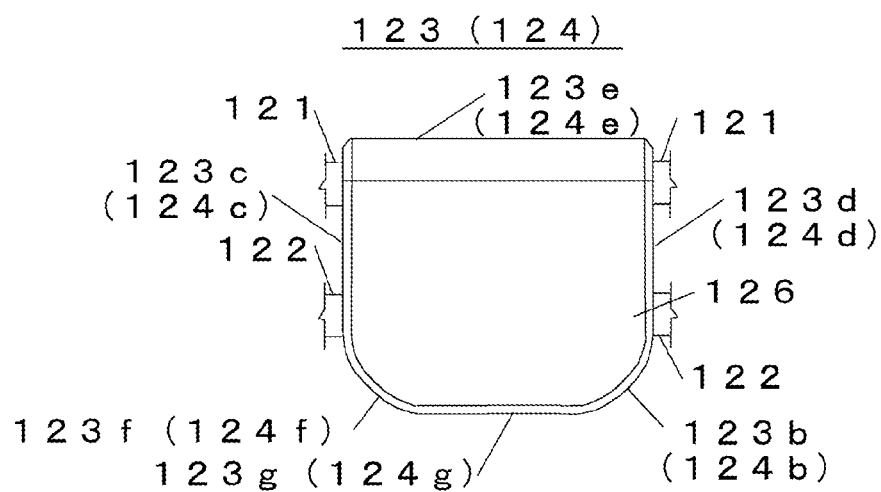
FIG. 8 is a rear view of the exterior component according to the embodiment.
Figure 9:
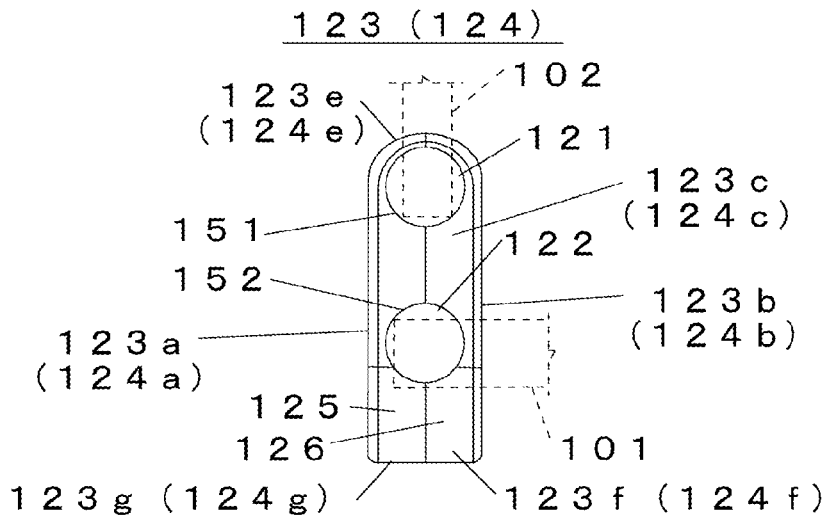
FIG. 9 is a side view of the exterior component according to the embodiment.

FIG. 7 is a front view of each of the exterior components 123 and 124 according to the present embodiment. FIG. 8 is a rear view of each of the exterior components 123 and 124 according to the present embodiment. FIG. 9 is a side view of each of the exterior components 123 and 124 according to the present embodiment. For each of the exterior components 123 and 124, a side thereof which is exposed in the case of the electronic device 100 being in the closed position and the opened position is referred to as a front surface, and a side opposite thereto is referred to as a rear surface.

Firstly, the exterior components 123 and 124 will be described.

The electronic device 100 includes the first exterior component 123 for the first rotation mechanism 120a and the second exterior component 124 for the second rotation mechanism 120b as described above. The first exterior component 123 and the second exterior component 124 rotate according to the second casing 102 being rotated in the case of the switching between the opened position and the inverted position being performed. The first exterior component 123 is a box-shaped component in which a first rotation shaft 121 and a second rotation shaft 122 of the first rotation mechanism 120a as described below are provided. The second exterior component 124 is a box-shaped component in which a first rotation shaft 121 and a second rotation shaft 122 of the second rotation mechanism 120b as described below are provided. The first exterior component 123 and the second exterior component 124 have the same structure. Therefore, in the following description, the first exterior component 123 will be described.

As shown in FIG. 9, the first exterior component 123 is a box-shaped component having a first principal surface 123a and a second principal surface 123b that are parallel to each other. In the first exterior component 123, a first side surface 123c and a second side surface 123d are also formed so as to be parallel to each other. One end face 123e (the upper surface in FIG. 9) of the first exterior component 123 is formed in a roughly semicircular shape as viewed in cross-section. Further, the other end face 123f of the first exterior component 123 is formed such that portions extending from the side surfaces 123c and 123d, respectively, are roughly arc-shaped so as to be curved inward, as shown in FIG. 7 and FIG. 8. Therefore, in a region of the other end face of the first exterior component 123, the width in the left-right direction shown in FIG. 7 and FIG. 8 is reduced toward the other end. In the center portion of the other end face 123f of the first exterior component 123, a flat surface 123g having a roughly rectangular shape is formed. The flat surface 123g extends parallel to the one end face 123e of the first exterior component 123. The flat surface 123g extends in a direction (the front-rear direction of the first casing 101) orthogonal to the second rotation shaft 122 described below.

As shown in FIG. 9, a first shaft receiver 151 for supporting the first rotation shaft 121 so as to allow the first rotation shaft 121 to be rotatable, and a second shaft receiver 152 for supporting the second rotation shaft 122 so as to allow the second rotation shaft 122 to be rotatable, are provided in the first exterior component 123. The first shaft receiver 151 is provided as circular through holes formed on one end side (the upper side portion in FIG. 9) of the first exterior component 123, in the first side surface 123c and the second side surface 123d, respectively. The second shaft receiver 152 is provided as circular through holes formed on the other end side (the lower side portion in FIG. 9) of the first exterior component 123, in the first side surface 123c and the second side surface 123d, respectively.

As shown in FIG. 9, the first exterior component 123 includes a first component 125 and a second component 126. The first component 125 and the second component 126 are integrated with each other by a screw being inserted into a screw insertion hole 125a formed in the first component 125 and fitted into a screw fitting portion (not shown) formed in the second component 126.

Subsequently, the hinge mechanism 120 will be described.

The hinge mechanism 120 includes the first rotation mechanism 120a and the second rotation mechanism 120b as described above. The first rotation mechanism 120a and the second rotation mechanism 120b rotate according to the second casing 102 being rotated in the case of the switching between the opened position and the inverted position being performed. The first rotation mechanism 120a and the second rotation mechanism 120b have the same structure. Therefore, in the following description, the first rotation mechanism 120a will be described.

The first rotation mechanism 120a includes: the first rotation shaft 121; the second rotation shaft 122; the first shaft receiver 151 for supporting the first rotation shaft 121 so as to allow the first rotation shaft 121 to be rotatable; and the second shaft receiver 152 for supporting the second rotation shaft 122 so as to allow the second rotation shaft 122 to be rotatable, as shown in FIG. 7, FIG. 8, and FIG. 9. The first rotation shaft 121 and the second rotation shaft 122 act as rotation shafts for opening and closing operation. The first rotation shaft 121 and the second rotation shaft 122 are each formed in a roughly cylindrical shape. As described above, the first shaft receiver 151 and the second shaft receiver 152 of the first rotation mechanism 120a are provided in the first exterior component 123. As described above, the first shaft receiver 151 and the second shaft receiver 152 of the second rotation mechanism 120b are provided in the second exterior component 124.

The first rotation shaft 121 is inserted into the first shaft receiver 151 (the through holes) formed in the first side surface 123c and the second side surface 123d, and projects from the first side surface 123c and the second side surface 123d. The first rotation shaft 121 of the first rotation mechanism 120a is fixed to the second casing 102 in the first hinge recess 132a of the second casing 102. The first rotation shaft 121 of the second rotation mechanism 120b is fixed to the second casing 102 in the second hinge recess 132b of the second casing 102.

The second rotation shaft 122 is inserted into the second shaft receiver 152 (the through holes) formed in the first side surface 123c and the second side surface 123d, and project from the first side surface 123c and the second side surface 123d. The second rotation shaft 122 of the first rotation mechanism 120a is fixed to the first casing 101 in the first hinge recess 131a of the first casing 101. The second rotation shaft 122 of the second rotation mechanism 120b is fixed to the first casing 101 in the second hinge recess 131b of the first casing 101.

[3. Function of Exterior Components and the Like]

Firstly, a state where the exterior components 123 and 124 are used as legs for the electronic device 100 in the opened position will be described.

FIG. 10 illustrates a state where the electronic device 100 according to the present embodiment is placed on a setting surface 160. FIG. 10(a) illustrates a case where the electronic device 100 is in the opened position. FIG. 10(b) illustrates a case where the electronic device 100 is in the inverted position.

As shown in FIG. 10(a), in a case where the electronic device 100 is in the opened position, the exterior components 123 and 124 project from the back surface 101b of the first casing 101. In this case, when the electronic device 100 is placed on the setting surface 160 such as a desk or the like, the exterior components 123 and 124 act as rear legs for the electronic device 100, to tilt the top surface 101a of the first casing 101 toward the near side.

The exterior components 123 and 124 rotate with the second casing 102 when switching between the opened position and the inverted position is performed, and thus switching between a state where the exterior components 123 and 124 project from the back surface 101b of the first casing 101 in the opened position, and a state where the exterior components 123 and 124 project from the top surface 101a of the first casing 101 in the inverted position, is performed. As shown in FIG. 10(b), in the inverted position, when the electronic device 100 is placed on the setting surface 160 such that the top surface 101a of the first casing 101 faces downward, the exterior components 123 and 124 act as the legs for the electronic device 100, to tilt the front surface 102a of the second casing 102 toward the near side.

Subsequently, movements of the exterior components 123 and 124 for switching from the opened position to the inverted position will be described.

FIG. 11 is a cross-sectional view illustrating movements of the hinge mechanism 120 and the exterior components 123 and 124 for switching the electronic device 100 according to the present embodiment from the closed position to the inverted position. FIG. 11(a) illustrates a case where the electronic device 100 is in the closed position. FIG. 11(b) illustrates a state where the second casing 102 is rotated about 180 degrees from the position shown in FIG. 11(a). FIG. 11(c) to FIG. 11(f) illustrate states where the second casing 102 is further rotated from the position shown in FIG. 11(b). In FIG. 11(f), the electronic device 100 is in the inverted position.

In the state shown in FIG. 11(a), the first rotation shaft 121 and the second rotation shaft 122 are aligned in order, respectively, from the upper side, in the thickness direction of the electronic device 100. When, in this state, a user opens the electronic device 100 and presses the second casing 102 backward, the second casing 102 is rotated about the first rotation shaft 121, and enters a state shown in FIG. 11(b). In this state, the front surface 102a of the second casing 102 and the top surface 101a of the first casing 101 face in the same direction. While the state shown in FIG. 11(a) shifts to the state shown in FIG. 11(b), although the second casing 102 rotates, the exterior components 123 and 124 do not rotate.

When the user presses the second casing 102 downward in the state shown in FIG. 11(b), the second casing 102 is rotated about the second rotation shaft 122, and shifts through the state shown in FIG. 11(c), the state shown in FIG. 11(d), and the state shown in FIG. 11(e), to the inverted position shown in FIG. 11(f). In the inverted position, the second rotation shaft 122 and the first rotation shaft 121 are aligned in order, respectively, from the upper side, in the thickness direction of the electronic device 100 in a state where the top surface 101a of the first casing 101 faces upward. While the state shown in FIG. 11(b) shifts to the state shown in FIG. 11(f), the exterior components 123 and 124 are rotated with the second casing 102.

The flat surface 123g that acts as the top end surface of the leg in each of the exterior components 123 and 124 passes in and through the hinge recesses 131a and 131b, as shown in FIG. 11(c), FIG. 11(d), and FIG. 11(e). In the inverted position shown in FIG. 11(f), the flat surface 123g of each of the exterior components 123 and 124 faces in the direction opposite to the direction in the opened position, and projects from the top surface 101a of the first casing 101.

Further, for switching between the closed position and the state shown in FIG. 11(b), the second casing 102 is rotated about the first rotation shaft 121. For switching between the state shown in FIG. 11(b) and the inverted position, the second casing 102 is rotated about the second rotation shaft 122. In the state shown in FIG. 11(b), if the second casing 102 is pressed downward, the first rotation shaft 121 does not rotate. Further, in the state shown in FIG. 11(b), if the second casing 102 is pressed upward, the second rotation shaft 122 does not rotate.

[4. Effects and the Like]

In the present embodiment, the exterior components 123 and 124 rotate with the hinge mechanism 120 when switching between the opened position and the inverted position is performed. Thus, switching between a state where the exterior components 123 and 124 project from the back surface 101b of the first casing 101 in the opened position, and a state where the exterior components 123 and 124 project from the top surface 101a of the first casing 101 in the inverted position, is performed. Therefore, the electronic device 100 that has the useful leg to be used in the opened position and the inverted position, can be provided. In the opened position, a user is allowed to easily connect a subject to be connected with a connection terminal for an electrical cord and a connection port for a peripheral device on the outer circumferential surface of the first casing 101. Further, in a case where a user places the electronic device 100 on the setting surface 160 so as to face the display 103 upward in the inverted position, contact of the operation sections 110 with the setting surface 160 can be avoided. Further, in the inverted position, a gap is generated between the electronic device 100 and the setting surface 160, and thus a user is allowed to easily lift the electronic device 100 from the setting surface 160.

In the present embodiment, the hinge mechanism 120 includes the rotation shafts 121 and 122 that allow the second casing 102 to rotate relative to the first casing 101 when switching between the closed position and the inverted position is performed, and the exterior components 123 and 124 are box-shaped components in which the rotation shafts 121 and 122 of the hinge mechanism 120 are provided. Therefore, the box-shaped components for the rotation shafts 121 and 122 of the hinge mechanism 120 are effectively utilized, to form legs for the electronic components.

Further, in the present embodiment, the rotation prevention portion 123g is further provided which prevents the exterior components 123 and 124 from rotating on the second rotation shaft 122 connected to the first casing 101, in a state where the exterior components 123 and 124 act as legs for the electronic device 100. Therefore, the electronic device 100 can be stably supported by means of the exterior components 123 and 124.

Further, in the present embodiment, the flat surface 123g is formed in the top end portion of the leg for the electronic device 100 as is implemented by each of the exterior components 123 and 124, so as to extend in the direction orthogonal to the second rotation shaft 122. The flat surface 123g acts as the rotation prevention portion. Therefore, the electronic device 100 can be stably supported by means of the exterior components 123 and 124 in a simplified structure.

Further, in the present embodiment, in each of the exterior components 123 and 124, its length in the direction in which the rotation shafts 121 and 122 extend is reduced toward the top end of the leg for the electronic device 100. Therefore, the sizes of the hinge recesses 131a and 131b in and through which the top ends of the exterior components 123 and 124 pass can be reduced.

(Other Embodiments)

As described above, the exemplary embodiment has been descried above as examples of the technology disclosed in the present application. However, the technology according to the present disclosure is not limited to the exemplary embodiment, and is also applicable to other embodiments implemented by modifications, replacements, additions, omissions, or the like as appropriate. Furthermore, another exemplary embodiment can be implemented by combining the components described above for the exemplary embodiment.

Hereinafter, other exemplary embodiments will be described.

In the embodiment described above, a notebook computer is described as an example of the electronic device 100. However, the electronic device 100 may be, for example, foldable mobile telephone terminals, foldable electronic game machines, and foldable electronic dictionary terminals. The electronic device may be a device that includes the hinge mechanism 120 that allows switching from the closed position through the opened position to the inverted position.

Further, in the embodiment described above, the exterior components 123 and 124 act as covers for the hinge mechanism 120. However, the exterior components 123 and 124 may be other components integrated with the cover for the hinge mechanism 120 when the exterior components 123 and 124 can rotate with the second casing 102 for switching between the opened position and the inverted position.

Further, in the present embodiment, the flat surface 123g of each of the exterior components 123 and 124 is described as an example of the rotation prevention portion. However, the rotation prevention portion is not limited thereto. The rotation prevention portion may be structured so as to mechanically lock the second rotation shaft 122. For example, the rotation prevention portion may be a projection that is operated by a user to switch between a state where the projection is fitted into a recess formed on the outer circumferential surface of the second rotation shaft 122, and a state where the projection is apart from the recess. The projection is, for example, formed in each of the exterior components 123 and 124 so as to be movable. The electronic device 100 is structured such that, if the second casing 102 is pressed upward in the state shown in FIG. 11(b), the exterior components 123 and 124 are prevented from rotating counterclockwise on the second rotation shaft 122. Therefore, even if a user draws the first casing 101 toward the near side in the case of the electronic device 100 being placed by using the exterior components 123 and 124 as the legs, rotation of the exterior components 123 and 124 on the second rotation shaft 122 due to a friction between the setting surface 160 and the exterior components 123 and 124, may be prevented. The rotation prevention portion may be structured so as to prevent the exterior components 123 and 124 from rotating (clockwise) on the second rotation shaft 122 in the case of a user pressing the first casing 101 toward the far side.

As presented above, one embodiment has been described as an example of the technology according to the present disclosure. For this purpose, the accompanying drawings and the detailed description are provided.

Therefore, components in the accompanying drawings and the detail description may include not only components essential for solving problems, but also components that are provided to illustrate the above described technology and are not essential for solving problems. Therefore, such inessential components should not be readily construed as being essential based on the fact that such inessential components are shown in the accompanying drawings or mentioned in the detailed description.

Further, the above described embodiment has been described to exemplify the technology according to the present disclosure, and therefore, various modifications, replacements, additions, and omissions may be made within the scope of the claims and the scope of the equivalents thereof.

What is claimed is:

1. An electronic device, comprising:
a first casing having an operation section on a top surface;
a second casing having a display on a front surface;
a hinge mechanism configured to connect the first casing to the second casing, the hinge mechanism configured to rotate the second casing, relative to the first casing, on a connection portion in which the first casing is connected to the second casing, to allow the electronic device to switch from a closed position where the front surface of the second casing overlaps the top surface of the first casing, through an opened position where the second casing is raised relative to the first casing, to an inverted position where a back surface of the second casing overlaps a back surface of the first casing;
an exterior component configured to rotate in synchronization with the second casing when switching between the opened position and the inverted position is performed, and to switch, by rotating in synchronization with the second casing, between a state where the exterior component projects from the back surface of the first casing to be a leg for the electronic device in the opened position, and a state where the exterior component projects from the top surface of the first casing to be a leg for the electronic device in the inverted position; and
a rotation prevention portion configured to prevent the exterior component from rotating on the rotation shaft connected to the first casing, when the exterior component is a leg for the electronic device;
wherein the rotation prevention portion comprises a flat surface that extends in a direction orthogonal to the rotation shaft, formed at a distal end of the exterior component.

2. The electronic device according to claim 1, wherein the hinge mechanism includes a rotation shaft configured to rotate the second casing relative to the first casing when switching between the closed position and the inverted position is performed, and the exterior component is a box-shaped component in which the rotation shaft of the hinge mechanism is provided.

3. The electronic device according to claim 2, wherein, in the exterior component, a length in a direction in which the rotation shaft extends is reduced toward a top end of the leg for the electronic device.

4. The electronic device according to claim 2, wherein the hinge mechanism includes a first rotation shaft and a second rotation shaft as the rotation shaft, the electronic device switches from the closed position to the inverted position, through a first shift state where the second casing is rotated relative to the first casing on the first rotation shaft, and a second shift state, immediately following the first shift state, where the second casing is rotated relative to the first casing on the second rotation shaft, and the exterior component is a box-shaped component in which the first rotation shaft and the second rotation shaft are provided.

5. The electronic device according to claim 4, wherein the first shift state includes a state where the operation section of the first casing and the display of the second casing face each other at an angle less than 180 degrees, and the second shift state includes a state where the operation section of the first casing and the display of the second casing form an angle greater than 180 degrees.

\* \* \* \* \*